(12) United States Patent
Miyano

(10) Patent No.: US 8,130,015 B2
(45) Date of Patent: Mar. 6, 2012

(54) CLOCK GENERATING CIRCUIT, SEMICONDUCTOR DEVICE INCLUDING THE SAME, AND DATA PROCESSING SYSTEM

(75) Inventor: Kazutaka Miyano, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/923,167

(22) Filed: Sep. 7, 2010

(65) Prior Publication Data

US 2011/0057697 A1    Mar. 10, 2011

(30) Foreign Application Priority Data

Sep. 8, 2009   (JP) ................................. 2009-207401

(51) Int. Cl.
*H03L 7/06*    (2006.01)
(52) U.S. Cl. .................. 327/156; 327/158; 327/161
(58) Field of Classification Search .................. None
See application file for complete search history.

(56) References Cited

U.S. PATENT DOCUMENTS

| | | | | |
|---|---|---|---|---|
| 6,262,611 | B1* | 7/2001 | Takeuchi | 327/159 |
| 6,701,445 | B1* | 3/2004 | Majos | 713/500 |
| 2006/0164139 | A1* | 7/2006 | Chong et al. | 327/158 |
| 2008/0218227 | A1 | 9/2008 | Maeda | |
| 2011/0242915 | A1* | 10/2011 | Ma | 365/194 |

FOREIGN PATENT DOCUMENTS

JP   2008-217947   9/2008

* cited by examiner

*Primary Examiner* — Tuan T Lam
(74) *Attorney, Agent, or Firm* — McGinn IP Law Group, PLLC

(57) ABSTRACT

To include a phase determining circuit that generates a first phase determination signal, a sampling circuit that samples the first phase determination signal and generates a second phase determination signal based on the sampled first phase determination signal, and a clock generating unit that generates an internal clock signal based on the second phase determination signal. The sampling circuit includes a continuity determining circuit that fixes the second phase determination signal when a logic level of the first phase determination signal changes within a sampling cycle, an initial operation circuit that fixes the second phase determination signal at a high level until when a third phase determination signal indicates a high level, and a disabling circuit that disables an operation of the continuity determining circuit after the third phase determination signal indicates a high level.

25 Claims, 8 Drawing Sheets

CLOCK GENERATING CIRCUIT, SEMICONDUCTOR DEVICE INCLUDING THE SAME, AND DATA PROCESSING SYSTEM

BACKGROUND OF THE INVENTION

1. Field of the Invention

The present invention relates to a clock generating circuit and a semiconductor device including the same, and more particularly relates to a clock generating circuit that generates a phase-adjusted internal clock signal such as a DLL (Delay Locked Loop) circuit, and a semiconductor device including the clock generating circuit. The present invention also relates to a data processing system including the semiconductor device.

2. Description of Related Art

In recent years, synchronous memories that operate synchronously with a clock have been widely used as main memories of personal computers and the like. Particularly, because DDR (Double Data Rate) synchronous memories need to accurately synchronize input/output (I/O) data with an external clock signal, a DLL circuit that generates an internal clock signal synchronously with the external clock signal is essential for the synchronous memories (see Japanese Patent Application Laid-open No. 2008-217947 or United States Patent Application Publication number 2008/0218227).

A DLL circuit includes a counter circuit of which a count value is updated based on phases of an external clock signal and an internal clock signal, and a delay line that generates an internal clock signal by delaying an external clock signal based on a count value of the counter circuit. The initial value of a counter circuit is often set at a minimum value or a maximum value, and in this system, the counter circuit is caused to forcibly count up or count down regardless of a phase determination result immediately after initializing the DLL circuit.

FIG. 8 is an explanatory diagram of an operation of a DLL circuit according to the above system.

FIG. 8 is a waveform diagram showing a relationship between a waveform of an external clock signal CK and an internal clock signal LCLK (not shown) as an output signal of a DLL circuit. As shown in FIG. 8, when a rising edge of the internal clock signal LCLK is at a position of a symbol A at an initializing time of the DLL circuit, the DLL circuit can be locked in a shortest time when a phase of the internal clock is synchronized with a rising edge #0 of an external clock signal CK by advancing the phase of the internal clock signal ahead the external clock signal CK (by decreasing a delay value of a delay line as a variable delay circuit by setting a counter circuit within the DLL circuit to count down). However, when an initial value of the counter circuit is already set at a minimum value (that is, when the delay line as a variable delay circuit is set at a minimum delay value), the counter circuit cannot further count down (a delay value cannot be further decreased). Therefore, from a time axis viewpoint, a phase of the internal clock signal needs to be delayed (the counter circuit needs to count up) such that a phase of the internal clock is synchronized with a next rising edge #1 of the external clock signal CK. That is, by a delay control of the variable delay circuit of the DLL circuit after initializing the DLL circuit, in a phase adjusting control up to "lock" indicating that a phase of the external clock signal CK matches a phase of the internal clock signal LCLK, the counter circuit needs to forcibly count up regardless of a phase comparison result showing count down, when a rising edge of the internal clock signal is located in a region B (specifically, a High period of the external clock signal CK) during an initial phase-control period of repetitively performing a delay adjustment of the delay line following a phase comparison and a result thereof. In this example, the phase comparison is performed to the rising edge of the external clock signal CK. In the following explanations, when a phase comparison result is "showing count down", it can be simply called "count down", and when a phase comparison result is "showing count up", it can be simply called "count up". A lock indicating that a phase of the external clock signal matches a phase of the internal clock signal is also called "DLL lock". The term "match (matching)" also means a case that a result of plural phase comparisons matches a predetermined result pattern from a time axis viewpoint, and it should be taken into account that the term does not simply mean a case that a result of a phase comparison at one time matches a predetermined result pattern.

Such a forcible count up operation naturally needs to be cancelled when the DLL circuit is locked. Therefore, a forcible count up operation is finished and count down or count up is performed as usual based on a result of a phase comparison, when a characteristic that appears at the time of locking the DLL circuit is detected, that is, when the internal clock signal approaches the rising edge #1 of the external clock signal immediately before reaching the lock and when a characteristic that a result of a phase comparison is an alternate repetition of count down and count up is detected.

However, the above characteristic that appears at a DLL locking time sometimes also appears when noise is received such as when a power source varies not only when the DLL is locked. For example, when a rising edge of the internal clock signal LCLK is still located in the region B shown in FIG. 8 and when a result of a phase comparison is a temporary change from count down to count up due to the influence of various noises despite a period of performing forcible count up regardless of a phase comparison result (count down), the result of a phase comparison is returned to the count down again when noise disappears. Therefore, there may be a false recognition that this shifting of a comparison result is a DLL lock (an edge of the internal clock signal reaches the rising edge #1 of the external clock signal CK). As another example, a phase comparison result returns to the count down again when a rising edge of the internal clock signal returns from a region C to the region B shown in FIG. 8 due to the influence of noise immediately after the rising edge of the internal clock signal moves from the region B to the region C (that is, immediately after a comparison result changes from count down to count up). Therefore, there may be a false recognition that this shifting of a comparison result is a DLL lock. When these false recognitions occur, a forcible count up operation is cancelled, and thus count down is progressed and the phase is advanced toward the rising edge #0.

However, in this example, a position of the symbol A corresponds to a minimum value of the counter circuit, and the counter circuit cannot count down any That is, the counter circuit is stuck at the position of the symbol A, and further phase adjustment cannot be made. That is, this phase adjusting control is stuck because the phase does not reach the rising edge #0 of the external clock signal even when the delay line is set at a minimum delay value as described above.

Such a problem occurs not only in DLL circuits but also commonly occurs in clock generating circuits that adjust a phase of an internal clock signal based on a result of a phase comparison.

SUMMARY

In one embodiment, there is provided a clock generating circuit comprising: a phase determining circuit that generates a first phase determination signal based on phases of a first clock signal and a second clock signal; a sampling circuit that samples the first phase determination signal at each sampling cycles and generates a second phase determination signal based on the sampled first phase determination signal; and a clock generating unit that generates a third clock signal based on the second phase determination signal, wherein the sampling circuit includes: a sampling unit that samples the first phase determination signal at each of the sampling cycles; a continuity determining circuit that prohibits a change in a logic level of the second phase determination signal in response to a change in a logic level of the first phase determination signal within a predetermined period; an initial operation circuit that fixes a logic level of the second phase determination signal at a predetermined logic level until when the first phase determination signal sampled by the sampling unit indicates the predetermined logic level after initialization; and a disabling circuit that disables an operation of the continuity determining circuit after the first phase determination signal sampled by the sampling unit indicates the predetermined logic level.

In another embodiment, there is provided a semiconductor device comprising: a phase determining circuit that generates a first phase determination signal based on phases of a first clock signal and a second clock signal each constituting one cycle in a high period and a low period; a sampling circuit that generates a second phase determination signal based on at least the first phase determination signal; and a clock generating unit that generates a third clock signal by delaying the first clock signal based on the second phase determination signal, the second clock signal being generated based on the third clock signal, wherein the sampling circuit sets the second phase determination signal as a signal that increases a delay amount regardless of the first phase determination signal, when a rising edge of the second clock signal is in the high period of the first clock signal, the sampling circuit sets the second phase determination signal as a signal that increases the delay amount based on the first phase determination signal, when a rising edge of the second clock signal reaches the low period from a high period of the first clock signal, and the sampling circuit sets the second phase determination signal as a signal that decreases the delay amount based on the first phase determination signal, when a rising edge of the second clock signal reaches a high period from a low period of the first clock signal.

According to the present invention, the clock generating circuit includes the continuity determining circuit that prohibits a change of a logic level of the second phase determination signal when a logic of the first phase determination signal changes within a predetermined period. Therefore, shifting of a phase determination signal when moving from the region B to the region C shown in FIG. 8 and temporary shifting of the first phase determination signal due to noise are disregarded. As a result, a conventional problem that the counter circuit is stuck can be solved.

Because the clock generating circuit includes the disabling circuit that disables subsequent operations of the continuity determining circuit when a sampled first phase-determination signal indicates a predetermined logic level, a delay of a DLL lock attributable to an operation of the continuity determining circuit does not occur.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

A representative example of a technical concept for solving the problem of the present invention is described below. It is needless to mention that the contents that the present application is to claim for patent are not limited to the following technical concept, but are the contents described in the appended claims. That is, according to the technical concept of the present invention, in a phase adjusting control of updating a count value to control a phase of the internal clock signal LCLK toward a rising edge of an external clock signal CK (a first clock signal), an operation of a continuity determining circuit is effective until when the internal clock signal LCLK exceeds ("passes" a time axis) a falling edge of a first clock signal present (appears) before a rising edge (#1) of the first clock signal without exception. However, the operation of the continuity determining circuit is disabled after the internal clock signal exceeds the falling edge of the first clock signal in the time axis, and a phase determination result is reflected to a delay amount of a variable delay circuit. That is, because the noise to be removed by the continuity determining circuit is generated until when the falling edge of the first clock signal is exceeded or is generated when the falling edge is exceeded, the operation of the continuity determining circuit is not necessary after the falling edge of the first clock signal is exceeded. Because a delay occurs in a determination time of a DLL lock when the continuity determining circuit is kept operated, the operation of the continuity determining circuit is disabled after the falling edge of the first clock signal is exceeded.

A preferred embodiment of the present invention is explained below with reference to the accompanying drawings.

Figure 1:
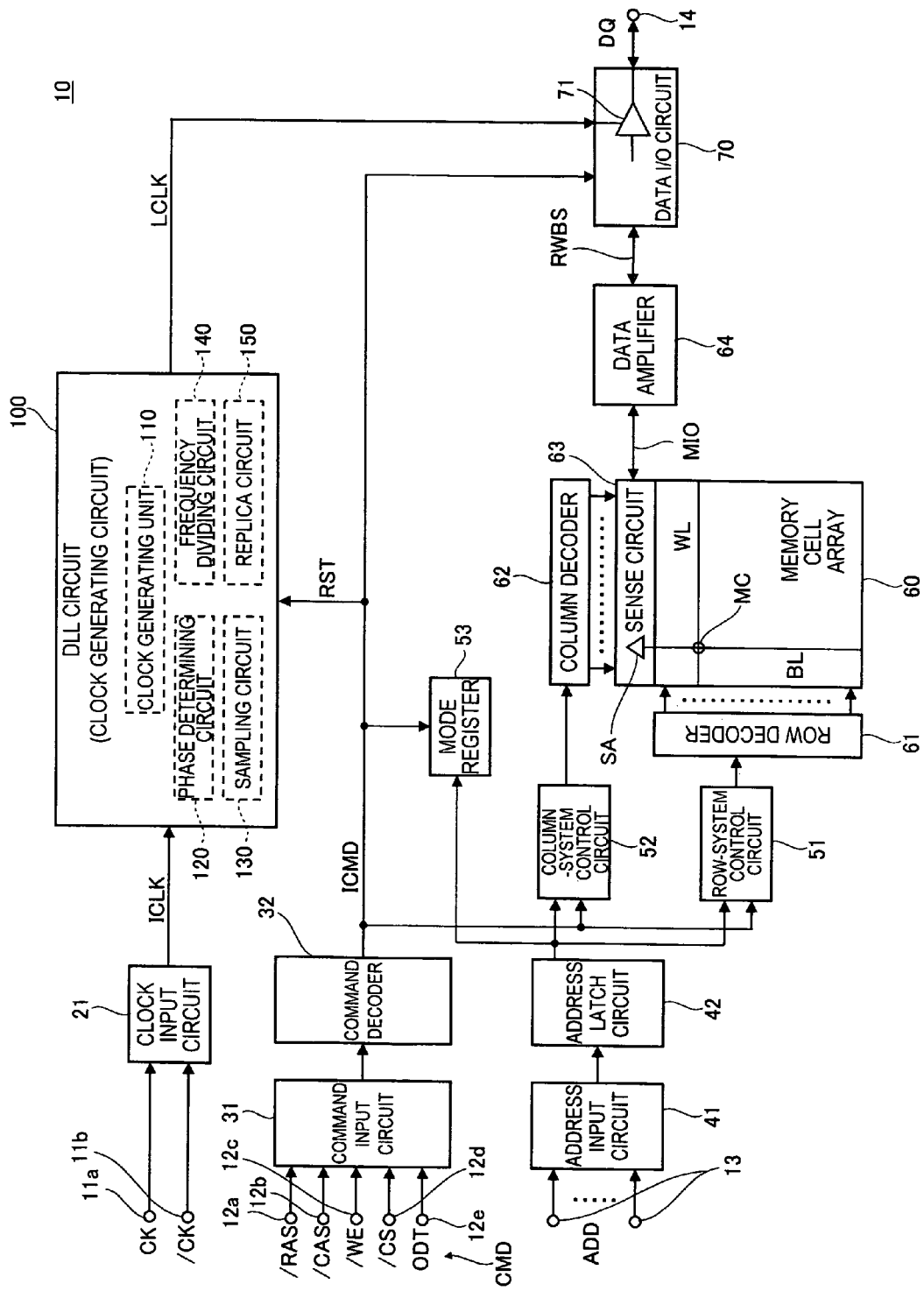
FIG. 1 is a block diagram showing an overall configuration of a semiconductor device 10 according to a preferred embodiment of the present invention.

FIG. 1 is a block diagram showing an overall configuration of a semiconductor device 10 according to a preferred embodiment of the present invention.

The semiconductor device 10 according to the present embodiment is a DDR SDRAM, and includes, as external terminals, clock terminals 11a and 11b, command terminals 12a to 12e, an address terminal 13, and a data I/O terminal 14. Although the semiconductor device 10 also includes a power source terminal, a data strobe terminal or the like, these terminals are not shown in FIG. 1.

The clock terminals 11a and 11b are supplied with external clock signals CK and /CK, respectively. The supplied external clock signals CK and /CK are supplied to a clock input circuit 21. In the present specification, signal having "/" at the head of a signal name means an inversion signal of a corresponding signal or a low active signal. Therefore, the external clock signals CK and /CK are mutually complementary signals. The clock input circuit 21 generates an internal clock signal ICLK of a single phase based on the external clock signals CK and /CK, and supplies these signals to a DLL circuit 100.

The DLL circuit 100 receives the internal clock signal ICLK, generates the internal clock signal LCLK phase-controlled to the external clock signals CK and /CK, and supplies the internal clock signal LCLK to at least a data I/O circuit 70. As shown in FIG. 1, the DLL circuit 100 includes a clock generating unit 110, a phase determining circuit 120, a sampling circuit 130, a frequency dividing circuit 140, and a replica circuit 150. Details of the DLL circuit 100 are described later.

The command terminals 12a to 12e are supplied with a row-address strobe signal /RAS, a column-address strobe signal /CAS, a write enable signal /WE, a chip select signal /CS, and an on-die termination signal ODT, respectively. These signals as command signals CMD are supplied to a command input circuit 31. The command signals CMD supplied to the command input circuit 31 are supplied to a command decoder 32. The command decoder 32 holds, decodes, and counts command signals, thereby generating various internal commands ICMD.

The internal commands ICMD generated are supplied to a row-system control circuit 51, a column-system control circuit 52, a mode register 53, the data I/O circuit 70, and the DLL circuit 100. As shown in FIG. 1, a reset signal RST out of the internal commands ICMD is supplied to at least the DLL circuit 100.

The address terminal 13 is supplied with an address signal ADD. The address signal ADD supplied to this terminal is next supplied to an address input circuit 41. An output of the address input circuit 41 is supplied to an address latch circuit 42. Out of the address signal ADD latched by the address latch circuit 42, a row address is supplied to the row-system control circuit 51, and a column address is supplied to the column-system control circuit 52. When entered in a mode register set, the address signal ADD is supplied to the mode register 53, thereby updating the content of the mode register 53.

An output of the row-system control circuit 51 is supplied to a row decoder 61. The row decoder 61 is a circuit that selects any one word line WL included in a memory cell array 60. In the memory cell array 60, plural word lines WL are intersected with plural bit lines BL, and memory cells MC are arranged at their intersections (FIG. 1 shows only one word line WL, one bit line BL, and one memory cell MC). The bit lines BL are connected to corresponding sense amplifiers SA in a sense circuit 63.

An output of the column-system control circuit 52 is supplied to a column decoder 62. The column decoder 62 selects any one sense amplifier SA included in the sense circuit 63. A sense amplifier SA selected by the column decoder 62 is connected to a data amplifier 64 via a main I/O line MIO. In a read operation, the data amplifier 64 amplifies read data once amplified by the sense amplifier SA, and supplies the amplified read data to the data I/O circuit 70 via a read/write bus RWBS. On the other hand, in a write operation, the data amplifier 64 amplifies write data supplied from the data I/O circuit 70 via the read/write bus RWBS, and supplies the amplified write data to the sense amplifier SA.

The data I/O terminal 14 is connected to the data I/O circuit 70, and outputs read data DQ and inputs write data DQ. The data I/O circuit 70 includes an output buffer 71. In a read operation, the data I/O circuit 70 outputs read data DQ from the output buffer 71 synchronously with the internal clock signal LCLK. Although FIG. 1 shows only one data I/O terminal 14, the number of the data I/O terminal 14 is not limited to one and plural I/O terminals 14 can be provided.

The overall configuration of the semiconductor device 10 according to the present invention is as described above. The DLL circuit 100 is explained next in detail.

Figure 2:
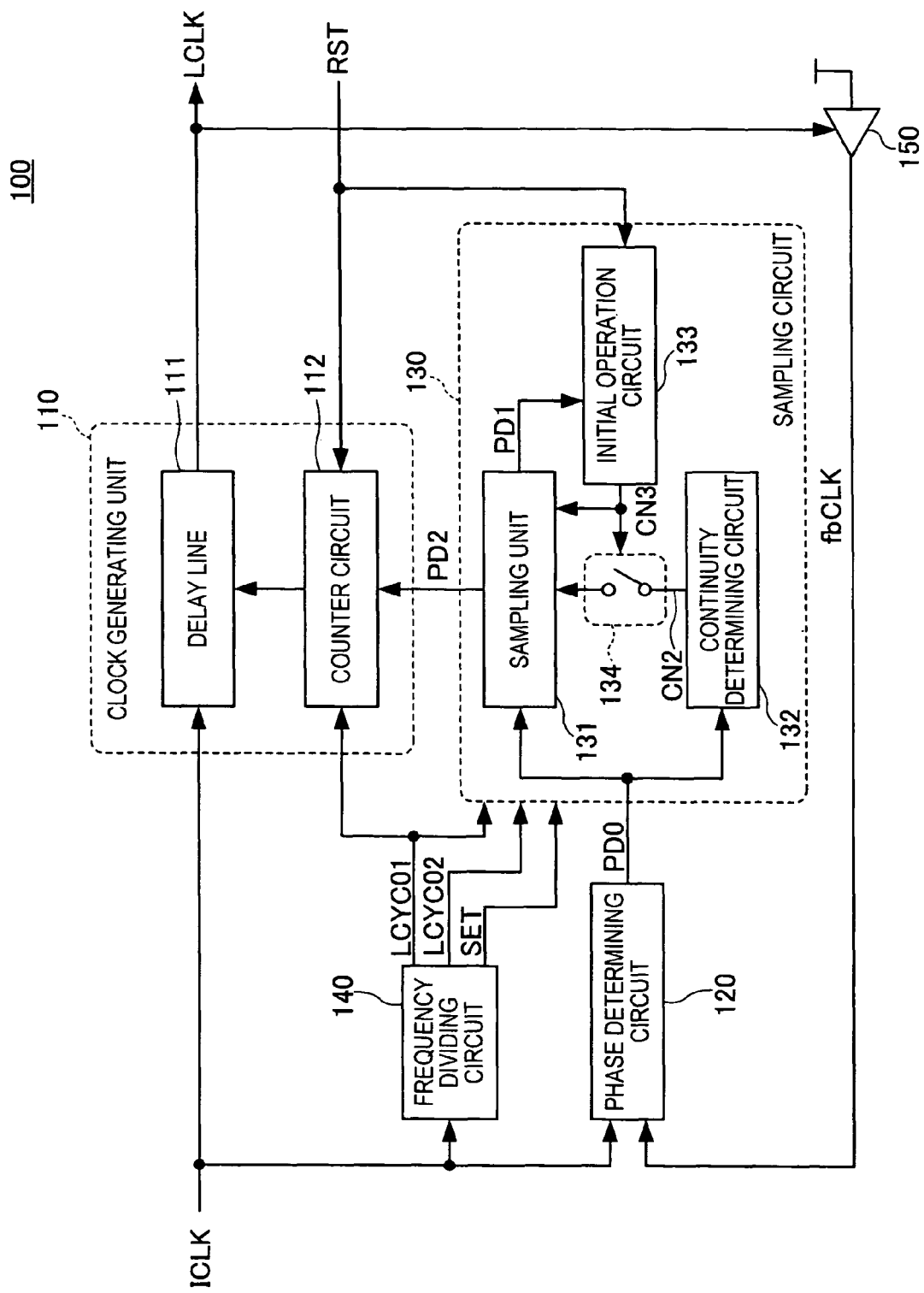
FIG. 2 is a block diagram showing a configuration of a DLL circuit 100.

FIG. 2 is a block diagram showing a configuration of the DLL circuit 100.

As shown in FIG. 2, the DLL circuit 100 includes the clock generating unit 110, the phase determining circuit 120, the sampling circuit 130, the frequency dividing circuit 140, and the replica circuit 150.

The clock generating unit 110 is a circuit block that generates the internal clock signal LCLK for output based on the internal clock signal ICLK, and includes a delay line 111 and a counter circuit 112. The delay line 111 is a circuit that generates the internal clock signal LCLK for output by delaying the internal clock signal ICLK, and its delay amount is determined by a count value of the counter circuit 112. Although not particularly limited, the delay line 111 preferably includes a coarse delay line delaying the internal clock signal ICLK at a relatively coarse adjustment pitch, and a fine delay line delaying the internal clock signal ICLK at a relatively fine adjustment pitch.

The counter circuit 112 is supplied with the reset signal RST from the command decoder 32 shown in FIG. 1. When the reset signal RST is input, a count value of the counter circuit 112 is reset at an initial value. In the present embodiment, an initial value of the counter circuit 112 is set at a minimum value. The minimum value is a minimum count value meaning that the delay amount of the delay line 111 cannot be made smaller.

As shown in FIG. 2, the internal clock signal LCLK is supplied to the replica circuit 150. The replica circuit 150 has substantially the same circuit configuration as that of the output buffer 71 shown in FIG. 1, and outputs a feedback clock signal fbCLK synchronously with the internal clock signal LCLK. Accordingly, a phase of the feedback clock signal fbCLK accurately matches a phase of the output signal (read data) DQ. However, a size of a transistor constituting the replica circuit 150 does not need to be the same as a size of a transistor constituting the output buffer 71. So long as impedances are substantially the same, shrunk transistors can be used. The replica circuit 150 also includes substantially the same circuit configuration as that of the clock input circuit 21.

The feedback clock signal fbCLK and the internal clock signal LCLK are supplied to the phase determining circuit 120. The phase determining circuit 120 detects a difference between a phase of the internal clock signal ICLK and a phase of the feedback clock signal fbCLK. As described above, a phase of the feedback clock signal fbCLK is adjusted to mach a phase of the internal clock signal ICLK by the delay line 111. However, both phases change at every moment due to a variation in parameters such as voltage and temperature giving influence to the delay amount of the delay line 111 and due to a variation in frequencies of the external clock signals CK and /CK. The phase determining circuit 120 detects these changes, and determines whether a phase of the feedback clock signal fbCLK is advanced or delayed from the internal clock signal ICLK (the external clock signal CK). This determination is performed at each cycle of the internal clock signal ICLK, and a result of determination is supplied to the sampling circuit 130 as a phase determination signal PD0.

The sampling circuit 130 samples the phase determination signal PD0 in each sampling cycle, and generates a phase determination signal PD2 based on this. The sampling circuit 130 includes a sampling unit 131, continuity determining circuit 132, an initial operation circuit 133, and a disabling circuit 134.

The sampling unit 131 samples the phase determination signal PD0 synchronously with sampling clock signals LCYC01 and LCYC02 that defines a sampling cycle. The sampling clock signals LCYC01 and LCYC02 are generated by the frequency dividing circuit 140. The frequency dividing circuit 140 generates the sampling clock signals LCYC01 and LCYC02 and a set signal SET having lower frequencies, by frequency-dividing the internal clock signal ICLK. Although not particularly limited, a frequency division number can be set at 16 or 32. Therefore, when the frequency dividing circuit 140 divides a frequency of the internal clock signal ICLK into 16, for example, the sampling clock signals LCYC01 and LCYC02 and the set signal SET are activated at every 16 cycles of the internal clock signal ICLK. In this case, a sampling cycle becomes 16 clock cycles. Needless to mention, the sampling cycle is 16 clock cycles of the external clock signal CK (/CK).

The continuity determining circuit 132 determines whether a logic level of the phase determination signal PD0 changes within a sampling cycle. In other words, the continuity determining circuit 132 determines whether a rising edge of the internal clock signal ICLK moves from the region B to the region C of the external clock signal in FIG. 8. When a logic level of the phase determination signal PD0 does not change (that is, a rising edge of the internal clock signal ICLK is present in the region B) within a sampling cycle as a result of determination by the phase determining circuit 120, an update enable signal CN2 as an output of the continuity determining circuit 132 is activated (High). On the other hand, when a logic level of the phase determination signal PD0 changes (that is, a rising edge of the internal clock signal ICLK moves to the region C) within a sampling cycle, the update enable signal CN2 is inactivated (Low). The update enable signal CN2 output from the continuity determining circuit 132 is supplied to the sampling unit 131 via the disabling circuit 134. As described later, the sampling unit 131 includes a latch circuit. When the update enable signal CN2 as an output of the continuity determining circuit 132 is activated (High), the latch circuit latches the signal, and a change of the phase determination signal PD2 is permitted. On the other hand, when the update enable signal CN2 is inactivated (Low), the latch circuit does not latch the signal, and a change of the phase determination signal PD2 is prohibited.

The initial operation circuit 133 forcibly fixes the phase determination signal PD2 at a high level by activating (Low) an initial state signal CN3 during a period from when the reset signal RST is input from the command decoder 32 shown in FIG. 1 until when a phase determination signal PD1 sampled by the sampling unit 131 becomes at a high level (that is, during a period when a rising edge of the internal clock signal ICLK is present in the region B). This is because an initial value of the counter circuit 112 is set at a minimum value (a minimum delay amount) in the present embodiment and because it is necessary to count up regardless of a logic level of the phase determination signal PD0 immediately after initialization of the DLL circuit.

The initial state signal CN3 is also supplied to the disabling circuit 134. The disabling circuit 134 disables the update enable signal CN2 as an output of the continuity determining circuit 132 when the initial state signal CN3 is inactivated, that is, when the phase determination signal PD1 sampled by the sampling unit 131 indicates a high level (that is, when arising edge of the internal clock signal ICLK moves from the region B to the region C). Therefore, after the initial state signal CN3 is inactivated, the continuity determining circuit 132 and the initial operation circuit 133 do not influence the operation of the sampling unit 131. Thereafter, a result of the phase determination signal PD0 is purely reflected to the phase determination signal PD2.

A circuit configuration of the sampling circuit 130 is explained next in detail.

Figure 3:
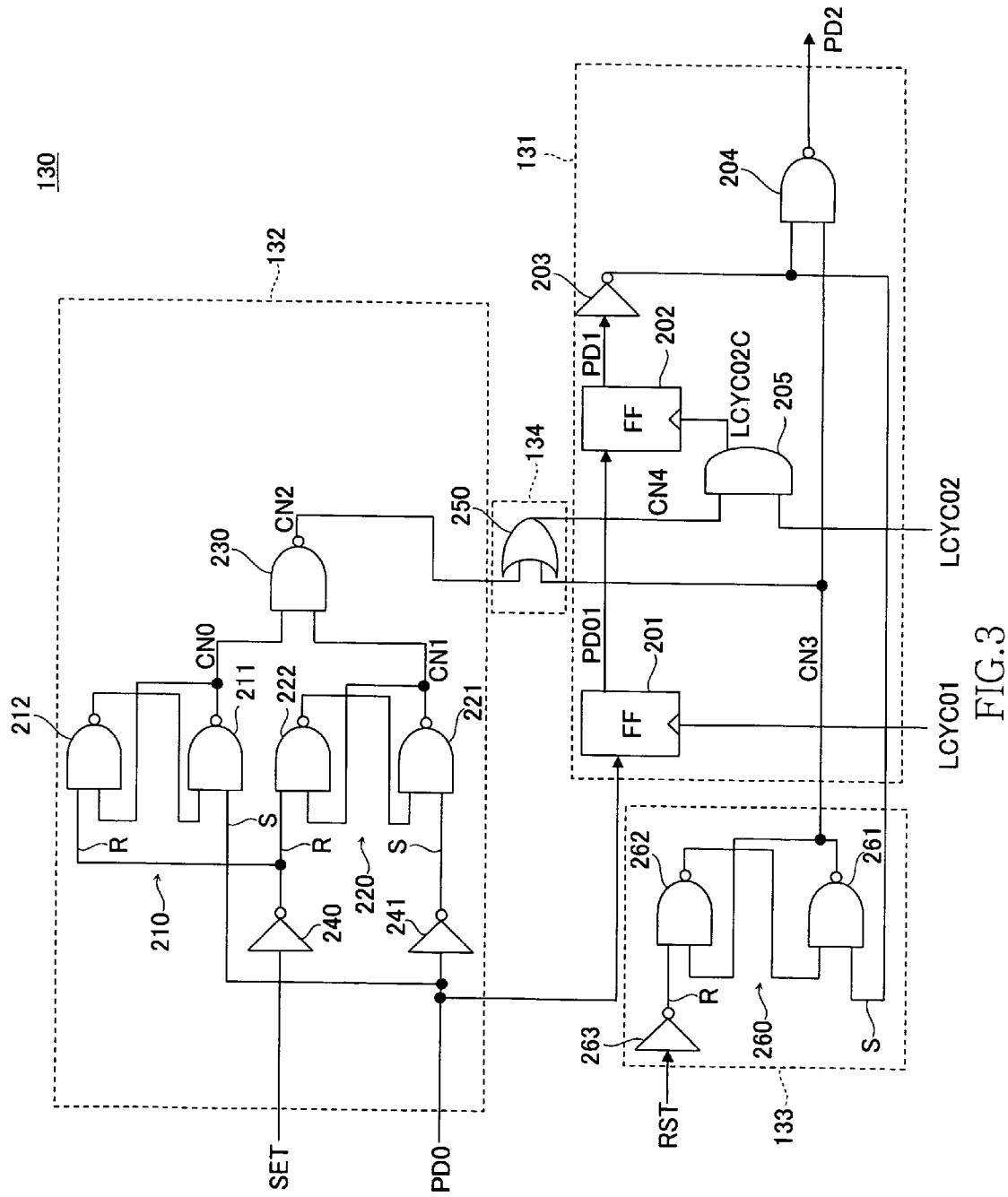
FIG. 3 is a circuit diagram showing a detailed configuration of a sampling circuit 130.

FIG. 3 is a circuit diagram showing a detailed configuration of the sampling circuit 130.

As shown in FIG. 3, the sampling unit 131 includes latch circuits 201 and 202 connected in cascade. The latch circuit 201 latches the phase determination signal PD0 synchronously with the sampling clock signal LCYC01, and an output of the phase determination signal PD0 is supplied to the latch circuit 202 of a next stage as a phase determination signal PD01. The latch circuit 202 latches the phase determination signal PD01 synchronously with the sampling clock signal LCYC02, and an output of the phase determination signal PD01 is used for the phase determination signal PD1. The phase determination signal PD1 inverted by an inverter 203 and the initial state signal CN3 supplied by the initial operation circuit 133 are supplied to a NAND gate 204, and an output of these signals is used for the phase determination signal PD2. Based on the above configuration, the phase determination signal PD2 is fixed at a high level during a period when the initial state signal CN3 is at a low level.

The sampling clock signal LCYC02 supplied to the latch circuit 202 is generated by an AND gate 205. The sampling clock signal LCYC02 and an update enable signal CN4 are supplied to the AND gate 205. Therefore, when the update enable signal CN4 is at a high level, the latch circuit 202 performs a latch operation synchronously with the sampling clock signal LCYC02. On the other hand, when the update enable signal CN4 is at a low level, the sampling clock signal LCYC02 is masked by the AND gate 205, thereby stopping a latch operation of the latch circuit 202. That is, a level of the phase determination signal PD1 as an output signal of the latch circuit 202 is fixed.

On the other hand, the continuity determining circuit 132 includes two SR latch circuits 210 and 220, and a NAND gate 230 receiving determination signals CN0 and CN1 as outputs of the SR latch circuits 210 and 220.

The SR latch circuit 210 is configured to have the NAND gates 211 and 212 connected in cyclic. A NAND gate 211 side is a set input end (S), and a NAND gate 212 side is a reset input end (R). The phase determination signal PD0 is supplied to the set input end (S), and the set signal SET inverted by the inverter 240 is supplied to the reset input end (R).

Similarly, the SR latch circuit 220 is configured to have the NAND gates 221 and 222 connected in cyclic. A NAND gate 221 side is a set input end (S), and a NAND gate 222 side is a reset input end (R). The phase determination signal PD0 inverted by the inverter 241 is supplied to the set input end (S), and the set signal SET inverted by the inverter 241 is supplied to the reset input end (R).

In this configuration, when the set signal SET is activated, one of the determination signals CN0 and CN1 becomes at a high level and the other determination signal becomes at a low level based on a logic level of the phase determination signal PD0. Therefore, immediately after activating the set signal SET, the update enable signal CN2 becomes at a high level without exception. Thereafter, the update enable signal CN2 maintains a high level when a logic level of the phase determination signal PD0 does not change. The update enable signal CN2 becomes at a low level when a logic level of the phase determination signal PD0 changes before the set signal SET is activated next. That is, the continuity determining circuit 132 can determine whether a logic level of the phase determination signal PD0 changes in an activation period of the set signal SET.

The update enable signal CN2 is supplied to one input end of an OR gate 250 constituting the disabling circuit 134. The initial state signal CN3 is supplied to the other input end of the OR gate 250. Therefore, when the initial state signal CN3 is at a low level, the update enable signal CN2 is output straight as the update enable signal CN4, and is supplied to the sampling unit 131. On the other hand, when the initial state signal CN3 is at a high level, the update enable signal CN4 is fixed at a high level regardless of the update enable signal CN2. That is, an operation of the continuity determining circuit 132 is disabled.

The initial state signal CN3 is generated by the initial operation circuit 133. The initial operation circuit 133 is configured by an SR latch circuit 260 having NAND gates 261 and 262 which are connected in cyclic. The phase determination signal PD1 inverted by the inverter 203 is supplied to the set input end (S), and the reset signal RST inverted by an inverter 263 is supplied to the reset input end (R). As described above, the reset signal RST is supplied from the command decoder 32. When the reset signal RST is activated, the DLL circuit 100 is reset, and a count value of the counter circuit 112 is also initialized at a minimum value.

In the above configuration, the initial state signal CN3 as an output of the initial operation circuit 133 becomes at a low level during a period from when the reset signal RST is activated until when the phase determination signal PD1 sampled indicates a high level. As described above, when the initial state signal CN3 is at a low level, the phase determination signal PD2 is fixed at a high level and an operation of the continuity determining circuit 132 is effective. The initial state signal CN3 is fixed at a high level after the phase determination signal PD1 indicates a high level. When the initial state signal CN3 becomes at a high level, the phase determination signal PD2 matches the phase determination signal PD1 and an operation of the continuity determining circuit 132 is disabled.

The circuit configuration of the semiconductor device 10 according to the present invention is as described above. An operation of the semiconductor device 10 according to the present embodiment is explained next while focusing on the DLL circuit 100.

Figure 4:
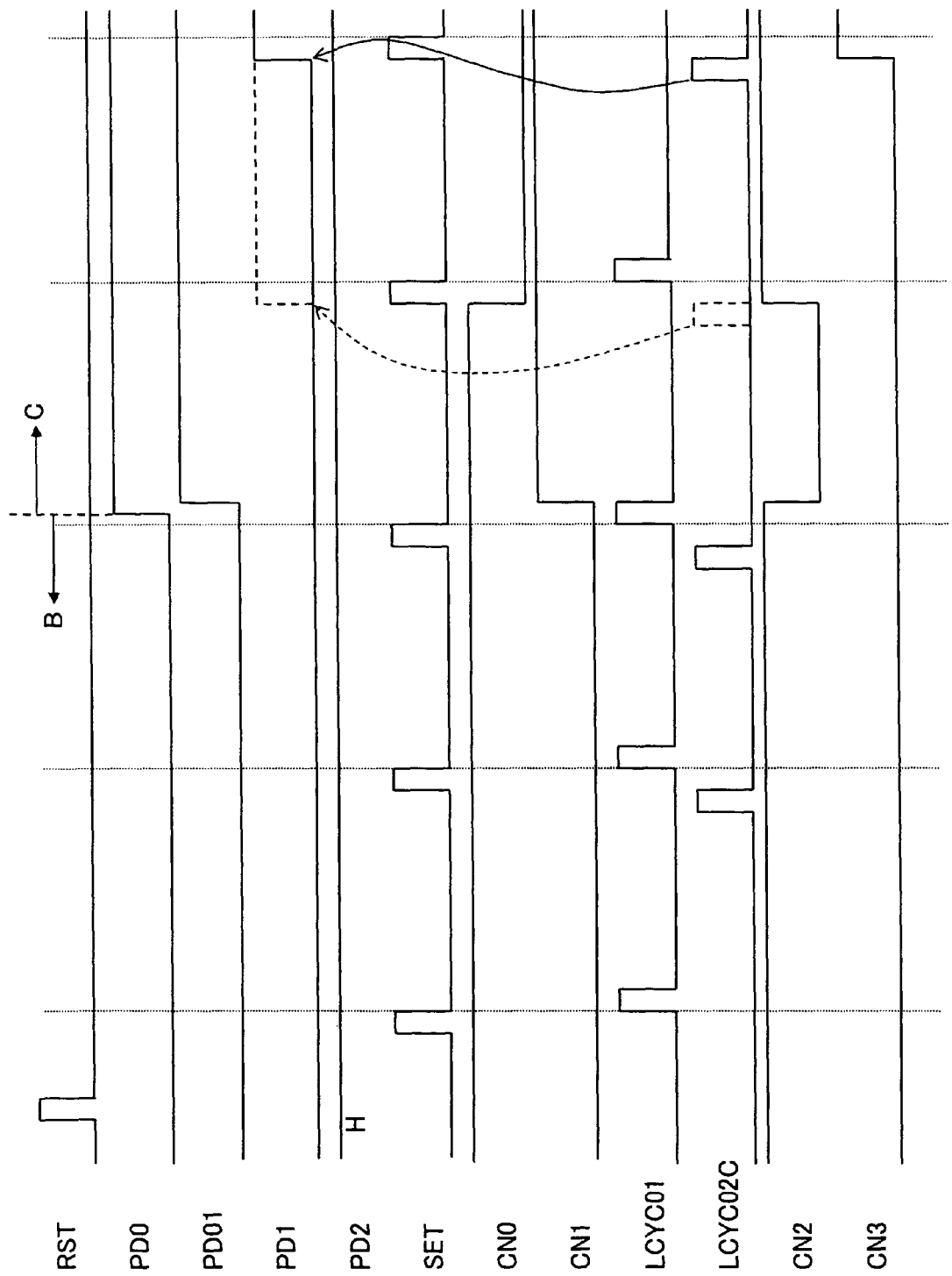
FIG. 4 is an operation waveform diagram for explaining the operation of the DLL circuit 100.

FIG. 4 is an operation waveform diagram for explaining the operation of the DLL circuit 100. FIG. 4 shows an operation during a period from when the DLL circuit is reset (indicating that a DLL reset command and the like are input from outside and the reset signal RST is output by the command decoder 32) until when a DLL is locked.

Figure 8:
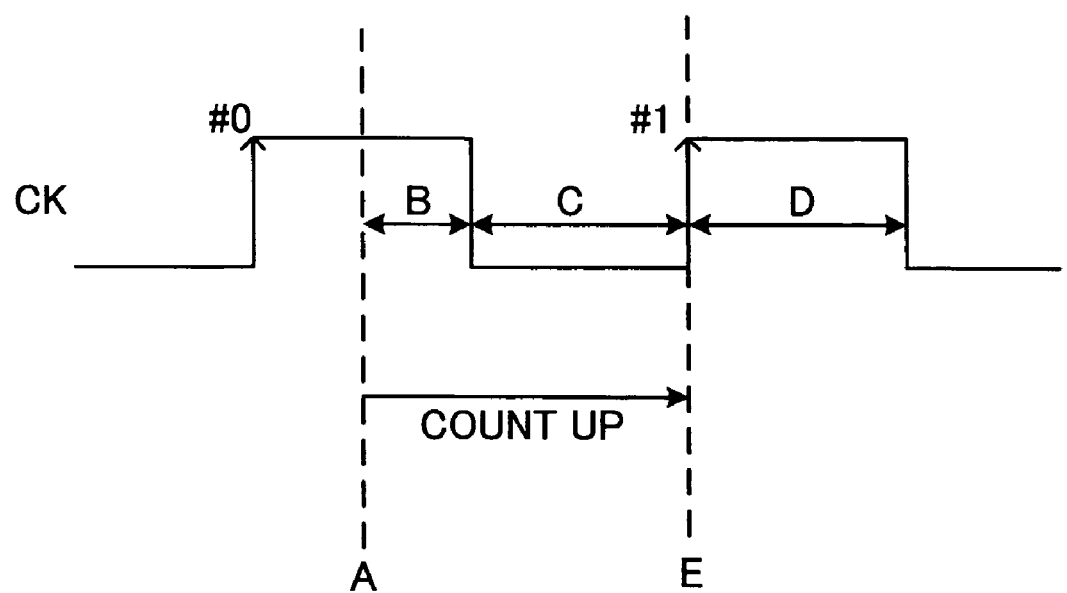
FIG. 8 is a diagram to explain a relationship between an active edge of an external clock signal CK and an active edge of an internal clock signal LCLK.

FIG. 4 shows a case that a rising edge of the internal clock signal LCLK (not shown in FIG. 4) is positioned at the symbol A shown in FIG. 8 at a reset time. Therefore, when the reset signal RST is activated, the phase determination signal PD0 first becomes at a low level, and this is sequentially latched by the latch circuits 201 and 202. Accordingly, the phase determination signal PD1 also becomes at a low level. Because the initial state signal CN3 is at a low level during a period until when the phase determination signal PD1 indicates a high level as described above, the phase determination signal PD2 is fixed at a high level. Consequently, the counter circuit 112 forcibly counts up regardless of a result of the phase determination signal PD0 output by the phase determination circuit 120. That is, the delay amount of the delay line 111 is forcibly increased, and a phase of the internal clock signal LCLK is controlled to be further delayed from the external clock signal CK.

Thereafter, when a rising edge of the internal clock signal LCLK moves from the region B to the region C, that is, when a rising edge of the internal clock signal LCLK passes a falling edge of the external clock signal CK, the phase determination signal PD0 changes to a high level. That is, when passing the falling edge of the external clock signal CK, a logic level of the phase determination signal PD0 changes during a sampling cycle. Therefore, the update enable signal CN2 as an output of the continuity determining circuit 132 changes from a high level to a low level. Consequently, the sampling clock signal LCYC02 in the sampling cycle is masked, and the phase determination signal PD1 which should change to a high level remains at a low level.

The phase determination signal PD1 changes to a high level in the next sampling cycle, and the initial operation circuit 133 is set. Accordingly, the initial state signal CN3 changes from a low level to a high level, and forcible count up of the counter circuit 112 finishes. Consequently, thereafter, a result of the phase determination signal PD0 is purely reflected to the phase determination signal PD2. After forcible count up of the counter circuit 112 finishes, the counter circuit 112 counts up or counts down as usual according to the phase determination signal PD2 based on the phase determination signal PD1 sampled by the sampling circuit 131. The counter circuit 112 continues count up because a rising edge of the internal clock signal LCLK has moved to the region C shown in FIG. 8.

As described above, the counter circuit 112 is caused to forcibly count up by the initial operation circuit 133 during a period from when the DLL circuit is reset until when a rising edge of the internal clock signal LCLK moves from the region B to the region C shown in FIG. 8, that is, until when a rising edge of the internal clock signal LCLK passes a falling edge of the external clock signal CK. Because a change in the phase determination signal PD0 generated when moving from the region B to the region C is disregarded by the continuity determining circuit 132, the DLL circuit 100 is not misidentified as being locked even when noise is superimposed.

Figure 5:
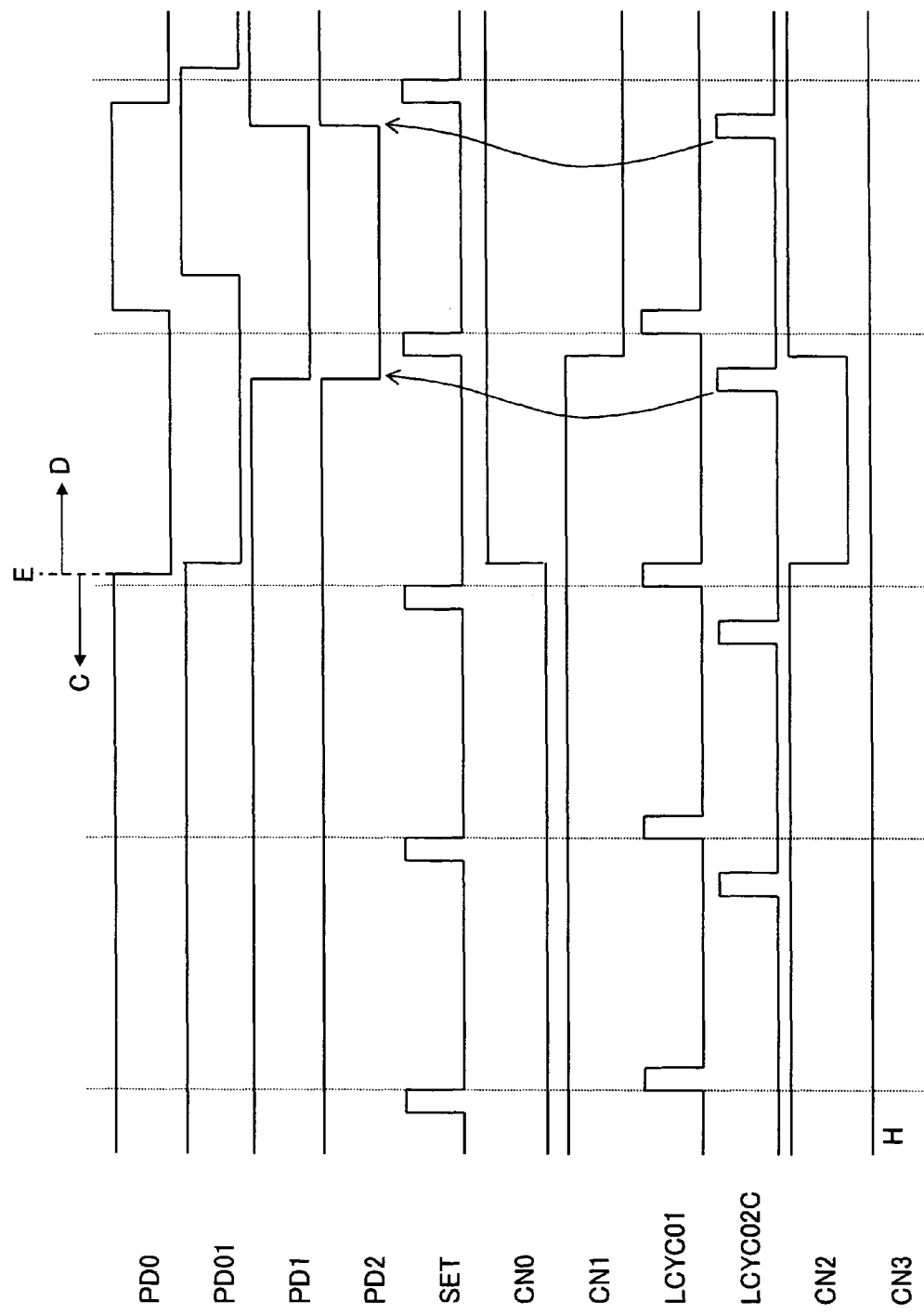
FIG. 5 is another operation waveform diagram for explaining an operation of the DLL circuit 100.

FIG. 5 is another operation waveform diagram for explaining an operation of the DLL circuit 100. FIG. 5 shows an operation when a DLL is locked. That is, FIG. 5 shows an operation when a rising edge of the internal clock signal LCLK reaches a position of a symbol E from the region C shown in FIG. 8.

As shown in FIG. 5, when a rising edge of the internal clock signal LCLK is present in the region C, the counter circuit 112 counts up because the phase determination signal PD2 is at a high level as described above. Thereafter, when a rising edge of the internal clock signal LCLK moves from the region C to the region D shown in FIG. 8, that is, when a rising edge of the internal clock signal LCLK passes a rising edge of the external clock signal CK, the phase determination signal PD0 changes to a low level. Accordingly, the counter circuit 112 counts down in the sampling cycle, and the delay amount of the delay line 111 decreases. That is, a phase of the internal clock signal LCLK is controlled to proceed to the external clock signal CK.

Accordingly, a rising edge of the internal clock signal LCLK returns from the region D to the region C shown in FIG. 8 next. Therefore, the phase determination signal PD0 becomes at a high level again, and the counter circuit 112 counts up in the sampling cycle. That is, this state of a repetition of count up and count down shows that the DLL circuit 100 is locked. By maintaining this lock state, the internal clock signal LCLK can correctly follow the external clock signal CK regardless of voltage variation or temperature change.

Figure 6:
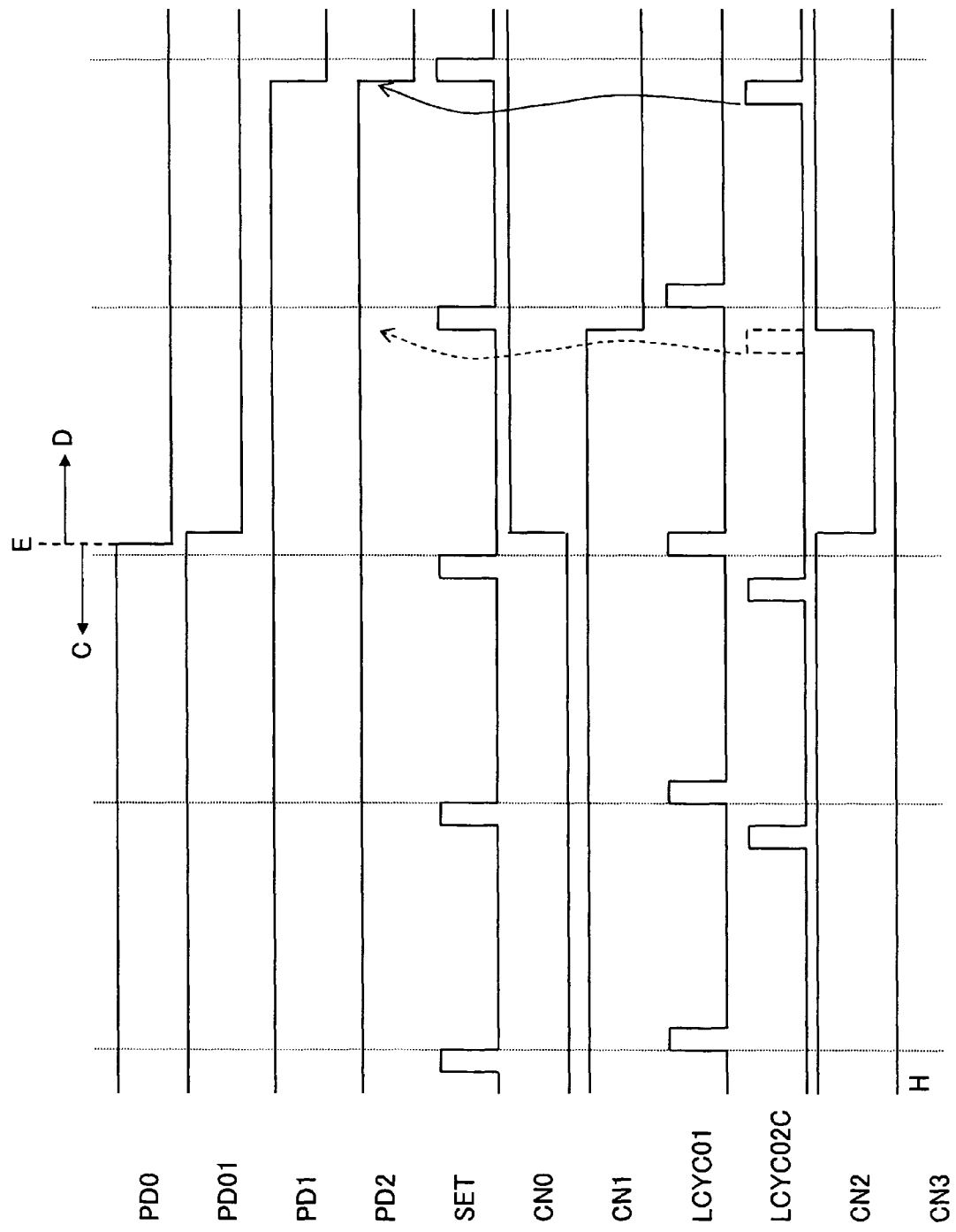
FIG. 6 is operation waveform diagram to explain a problem in case a disabling circuit 134 is not provided.

In the present embodiment, an operation of the continuity determining circuit 132 is disabled after the phase determination signal PD1 changes to a high level, that is, after a rising edge of the internal clock signal LCLK reaches the region C. Therefore, the DLL circuit 100 can be quickly locked. That is, when a rising edge of the internal clock signal LCLK passes a rising edge (the position E) of the external clock signal CK, a logic level of the phase determination signal PD0 changes in the sampling cycle. Consequently, if an operation of the continuity determining circuit 132 is effective, a lock of the DLL circuit 100 is delayed by at least one sampling cycle as shown in FIG. 6. That is, because a sampling cycle is at every 16 clock cycles of the internal clock signal ICLK (16 clock cycles of the external clock signal CK), a time to reach a lock is delayed by this time. However, in the present embodiment, after the phase determination signal PD1 indicates a high level, the disabling circuit 134 disables the operation of the continuity determining circuit 132. Therefore, a problem that a lock of the DLL circuit 100 is delayed does not occur, and the DLL circuit 100 can be quickly locked.

As explained above, according to the present embodiment, because the operation of the continuity determining circuit 132 is set effective immediately after a reset, a change in the phase determination signal PD0 generated when a rising edge of the internal clock signal LCLK moves from the region B to the region C shown in FIG. 8 is disregarded. Accordingly, a problem that the counter circuit 112 is stuck does not occur.

Furthermore, after a rising edge of the internal clock signal LCLK moves from the region B to the region C shown in FIG. 8, a subsequent operation of the continuity determining circuit 132 is disabled. Therefore, a delay in a DLL lock attributable to an operation of the continuity determining circuit 132 does not occur.

Figure 7:
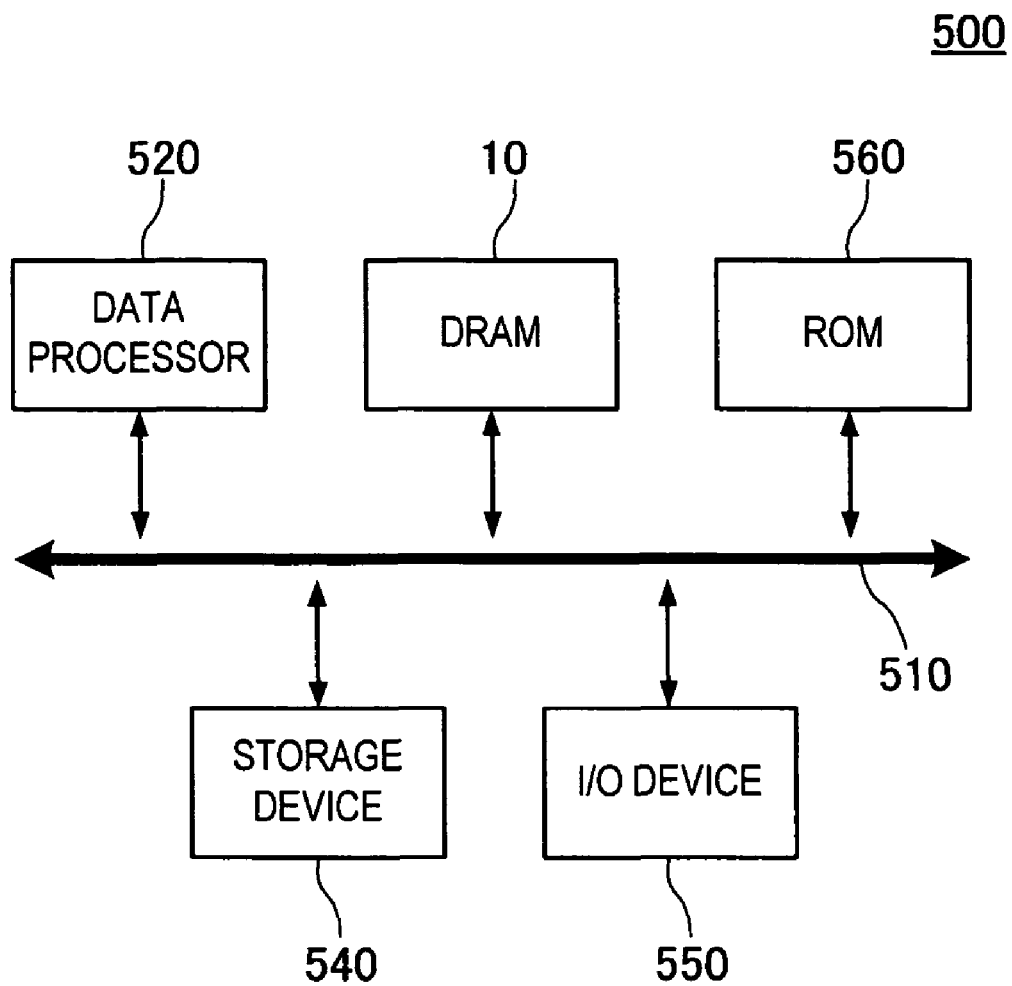
FIG. 7 is a block diagram showing a configuration of a data processing system 500 using the semiconductor device 10 according to the present embodiment.

FIG. 7 is a block diagram showing a configuration of a data processing system 500 using the semiconductor device 10 according to the present embodiment.

The data processing system 500 shown in FIG. 7 has a configuration that a data processor 520 and the semiconductor device (DRAM) 10 are connected to each other via a system bus 510. The data processor 520 is a microprocessor (MPU), a digital signal processor (DSP) or the like as an example but not limited to. Although the data processor 520 and the DRAM 10 are connected to each other via the system bus 510 for simplicity in FIG. 7, these units can be connected to each other via a local bus without via the system bus 510.

In the data processing system 500 shown in FIG. 7, at least the clock terminals 11a and 11b (first external terminals) and the data I/O terminal 14 (second external terminals) of the semiconductor device 10 shown in FIG. 1 are connected to the data processor 520 via the system bus 510.

Although FIG. 7 shows only one system bus 510 for simplicity, plural system buses 510 can be provided serially or in parallel via connectors as necessary. In a memory-system data processing system shown in FIG. 7, a storage device 540, an I/O device 550, and a ROM 560 are connected to the system bus 510, but these are not necessarily essential constituent elements.

The storage device 540 can include a hard disk drive, an optical disk drive, and a flash memory. The I/O device 550 can include a display device such as a liquid crystal display, and an input device such as a keyboard and a mouse. The I/O device 550 can be either an input device or an output device.

In addition, although FIG. 7 shows each of the constituent elements as one for simplicity, the present invention is not limited thereto and it is also possible to provide these constituent elements in plural.

It is apparent that the present invention is not limited to the above embodiments, but may be modified and changed without departing from the scope and spirit of the invention.

For example, while an SDRAM having a DLL circuit incorporated therein has been explained in the above embodiment, the application range of the present invention is not limited thereto, and the invention is also applicable to semiconductor devices other than memories. Specifically, the present invention can be applied to semiconductor products in general, such as a CPU (Central Processing Unit), MCU (Micro Control Unit), DSP (Digital Signal Processor), ASIC (Application Specific Integrated Circuit), or ASSP (Application Specific Standard Circuit), having an DLL circuit incorporated therein.

The clock generating circuit according to the present invention is not limited to a DLL circuit, and the present invention can be also applied to other various clock generating circuits as far as the circuits generate a phase-adjusted internal clock signal.

Further, although periods of the set signal SET and the sampling clock signals LCYC01 and LCYC02 are the same in the above embodiment, these periods are not necessarily the same.

In the above embodiment, although the initial value of the counter circuit 112 is a minimum value, the initial value of the counter circuit 112 can be a maximum value. That is, the counter circuit 112 can start with count down. Specifically, in FIG. 8, when a rising edge of the internal clock signal LCLK is located in the region C at an initialization time of the DLL circuit, a phase of the internal clock signal can be synchronized with the rising edge #0 of the external clock signal CK by advancing the phase of the internal clock signal from the external clock signal CK (by minimizing a delay value of the delay line as a variable delay circuit by counting down the counter circuit in the DLL circuit). The present invention can be also applied to a case where an initial value of the counter circuit 112 is biased to a minimum value or to a maximum value from an intermediate value, and the initial value is not necessarily a minimum value or a maximum value. When the initial value is biased to a minimum value or to a maximum value from an intermediate value, the counter circuit 112 can be stuck because a total count number that can be counted from an initial value when the phase determination signal PD2 is at the other logic level becomes smaller than a total count number that can be counted from an initial value when the phase determination signal PD2 is at one logic level.

A device to which the present invention is applied can be also applied to a semiconductor device such as an SOC (System on Chip), MCP (Multi Chip Package), and POP (Package on Package). Furthermore, the transistor of the present invention can be an FET (Field Effect Transistor) or a bipolar transistor. The transistor can be applied to various types of FETs such as a MIS (Metal-Insulator Semiconductor) and TFT (Thin Film Transistor) as well as MOS (Metal Oxide Semiconductor). The type of the transistor can be other than FETs, and a bipolar transistor can be partially included.

Furthermore, a P-channel transistor or a PMOS transistor is a representative example of a first conductive transistor, and an N-channel transistor and an NMOS transistor is a representative example of a second conductive transistor. Further, a semiconductor substrate used in the present invention is not limited to a P-type semiconductor substrate, and it can be an N-type semiconductor substrate, a semiconductor substrate with an SOI (Silicon on Insulator) structure, or other types of semiconductor substrates.

Furthermore, the circuit form of the continuity determining circuit, initial operation circuit or the like are not limited to those disclosed in the above embodiment.

Different combinations and selections of various disclosed elements can be made within the scope of the claims of the present invention. That is, it should be readily understood that the present invention embraces the entire disclosure of this specification including the claims, as well as various changes and modifications that can be achieved by those skilled in the art based on the technical concept of the invention.

What is claimed is:

1. A semiconductor device comprising:
    a phase determining circuit that generates a first phase determination signal based on phases of a first clock signal and a second clock signal each constituting one cycle in a high period and a low period;
    a sampling circuit that generates a second phase determination signal based on at least the first phase determination signal; and
    a clock generating unit that generates a third clock signal by delaying the first clock signal based on the second phase determination signal, the second clock signal being generated based on the third clock signal, wherein
    the sampling circuit sets the second phase determination signal as a signal that increases a delay amount regardless of the first phase determination signal, when a rising edge of the second clock signal is in the high period of the first clock signal,
    the sampling circuit sets the second phase determination signal as a signal that increases the delay amount based on the first phase determination signal, when a rising edge of the second clock signal reaches the low period from a high period of the first clock signal, and
    the sampling circuit sets the second phase determination signal as a signal that decreases the delay amount based on the first phase determination signal, when a rising edge of the second clock signal reaches a high period from a low period of the first clock signal.

2. The semiconductor device as claimed in claim 1, wherein
    the sampling circuit samples the first phase determination signal at each of sampling cycles, and generates the second phase determination signal based on the sampled first phase determination signal, and
    the sampling circuit includes:
    a sampling unit that samples the first phase determination signal at each of the sampling cycles;
    a continuity determining circuit that prohibits a change in a logic level of the second phase determination signal in response to a change in a logic level of the first phase determination signal within a predetermined period;
    an initial operation circuit that fixes a logic level of the second phase determination signal at a predetermined logic level until when the first phase determination signal sampled by the sampling unit indicates the predetermined logic level after initializing the clock generating circuit; and
    a disabling circuit that disables an operation of the continuity determining circuit after the first phase determination signal sampled by the sampling unit indicates the predetermined logic level.

3. The semiconductor device as claimed in claim 2, wherein the predetermined period is equal to the sampling cycle.

4. The semiconductor device as claimed in claim 2, wherein
    the sampling unit comprises a latch circuit that latches the first phase determination signal synchronously with a sampling clock signal, and
    the continuity determining circuit temporarily stops the sampling clock signal in response to a change in a logic level of the first phase determination signal within the predetermined period.

5. The semiconductor device as claimed in claim 2, wherein
    the clock generating unit includes:
    a delay line that generates the third clock signal by delaying the first clock signal; and
    a counter circuit that sets a delay amount of the delay line, and
    a count value of the counter circuit is updated based on the second phase determination signal.

6. The semiconductor device as claimed in claim 5, wherein a count value of the counter circuit is updated at each of the sampling cycles.

7. The semiconductor device as claimed in claim 5, wherein an initial value of the counter is biased to a minimum value or to a maximum value from an intermediate value, and a total count number that can be counted from the initial value when a logic level of the second phase determination signal is opposite to the predetermined logic level is smaller than a total count number that can be counted from the initial value when the second phase determination signal is at the predetermined logic level.

8. The semiconductor device as claimed in claim 7, wherein an initial value of the counter is set at the minimum value or the maximum value.

9. The semiconductor device as claimed in claim 1, further comprising a replica circuit that generates the second clock signal based on the third clock signal.

10. The semiconductor device as claimed in claim 1, further comprising an output buffer that outputs an output signal to outside synchronously with the third clock signal, wherein
    the first clock signal is supplied to a first external terminal of the semiconductor device, and
    the output signal is supplied to a second external terminal of the semiconductor device.

11. A data processing system comprising the semiconductor device as claimed in claim 10 and a controller connected to the first and second external terminals of the semiconductor device.

12. A semiconductor device comprising:
    a phase determining circuit that generates a first phase determination signal based on phases of a first clock signal and a second clock signal each constituting one cycle in a high period and a low period;
    a sampling circuit that generates a second phase determination signal based on at least the first phase determination signal; and
    a clock generating unit that generates a third clock signal by delaying the first clock signal based on the second phase determination signal, the second clock signal being generated based on the third clock signal, wherein
    the sampling circuit sets the second phase determination signal as a signal that decreases a delay amount regardless of the first phase determination signal, when a rising edge of the second clock signal is in the low period of the first clock signal,
    the sampling circuit sets the second phase determination signal as a signal that decreases the delay amount based on the first phase determination signal, when a rising edge of the second clock signal reaches the high period from a low period of the first clock signal, and the sampling circuit sets the second phase determination signal as a signal that increases the delay amount based on the first phase determination signal, when a rising edge of the second clock signal reaches a low period from a high period of the first clock signal.

13. The semiconductor device as claimed in claim 12, wherein the sampling circuit samples the first phase determination signal at each of sampling cycles, and generates the second phase determination signal based on the sampled first phase determination signal, and the sampling circuit includes:

a sampling unit that samples the first phase determination signal at each of the sampling cycles;

a continuity determining circuit that prohibits a change in a logic level of the second phase determination signal in response to a change in a logic level of the first phase determination signal within a predetermined period;

an initial operation circuit that fixes a logic level of the second phase determination signal at a predetermined logic level until when the first phase determination signal sampled by the sampling unit indicates the predetermined logic level after initializing the clock generating circuit; and a disabling circuit that disables an operation of the continuity determining circuit after the first phase determination signal sampled by the sampling unit indicates the predetermined logic level.

14. The semiconductor device as claimed in claim 13, wherein the predetermined period is equal to the sampling cycle.

15. The semiconductor device as claimed in claim 13, wherein the sampling unit comprises a latch circuit that latches the first phase determination signal synchronously with a sampling clock signal, and the continuity determining circuit temporarily stops the sampling clock signal in response to a change in a logic level of the first phase determination signal within the predetermined period.

16. The semiconductor device as claimed in claim 15, wherein the clock generating unit includes:

a delay line that generates the third clock signal by delaying the first clock signal; and a counter circuit that sets a delay amount of the delay line, and a count value of the counter circuit is updated based on the second phase determination signal.

17. The semiconductor device as claimed in claim 16, wherein a count value of the counter circuit is updated at each of the sampling cycles.

18. The semiconductor device as claimed in claim 17, wherein an initial value of the counter is biased to a minimum value or to a maximum value from an intermediate value, and a total count number that can be counted from the initial value when a logic level of the second phase determination signal is opposite to the predetermined logic level is smaller than a total count number that can be counted from the initial value when the second phase determination signal is at the predetermined logic level.

19. The semiconductor device as claimed in claim 18, wherein an initial value of the counter is set at the minimum value or the maximum value.

20. The semiconductor device as claimed in claim 12, further comprising a replica circuit that generates the second clock signal based on the third clock signal.

21. The semiconductor device as claimed in claim 12, further comprising an output buffer that outputs an output signal to outside synchronously with the third clock signal, wherein the first clock signal is supplied to a first external terminal of the semiconductor device, and the output signal is supplied to a second external terminal of the semiconductor device.

22. A data processing system comprising the semiconductor device as claimed in claim 21 and a controller connected to the first and second external terminals of the semiconductor device.

23. A semiconductor device comprising:

a clock generating circuit that generates an internal clock signal; and an output buffer that outputs an output signal to outside synchronously with the internal clock signal, wherein the clock generating circuit comprises:

a phase determining circuit that generates a first phase determination signal based on phases of an external clock signal and a feedback clock signal;

a sampling circuit that samples the first phase determination signal at each of sampling cycles and generates a second phase determination signal based on the sampled first phase determination signal;

a clock generating unit that generates the internal clock signal based on the external clock signal and the second phase determination signal; and a replica circuit that generates the feedback signal based on the internal clock signal, the sampling circuit includes:

a sampling unit that samples the first phase determination signal at each of the sampling cycles;

a continuity determining circuit that prohibits a change in a logic level of the second phase determination signal in response to a change in a logic level of the first phase determination signal within a predetermined period;

an initial operation circuit that fixes a logic level of the second phase determination signal at a predetermined logic level until when the first phase determination signal sampled by the sampling unit indicates the predetermined logic level after initialization; and a disabling circuit that disables an operation of the continuity determining circuit after the first phase determination signal sampled by the sampling unit indicates the predetermined logic level, and the replica circuit has substantially a same circuit configuration as that of the output buffer.

24. A data processing system comprising the semiconductor device as claimed in claim 23 and a controller connected to first and second external terminals of the semiconductor device, wherein the first external terminal is supplied with the external clock signal, and the second external terminal is connected to the output buffer.

25. A clock generating circuit comprising:

a phase determining circuit that generates a first phase determination signal based on phases of a first clock signal and a second clock signal;

a sampling circuit that samples the first phase determination signal at each sampling cycles and generates a second phase determination signal based on the sampled first phase determination signal; and a clock generating unit that generates a third clock signal based on the second phase determination signal, wherein the sampling circuit includes:

a sampling unit that samples the first phase determination signal at each of the sampling cycles;

a continuity determining circuit that prohibits a change in a logic level of the second phase determination signal in response to a change in a logic level of the first phase determination signal within a predetermined period;

an initial operation circuit that fixes a logic level of the second phase determination signal at a predetermined logic level until when the first phase determination signal sampled by the sampling unit indicates the predetermined logic level after initialization; and a disabling circuit that disables an operation of the continuity determining circuit after the first phase determination signal sampled by the sampling unit indicates the predetermined logic level.

\* \* \* \* \*